(12) United States Patent
Eriguchi et al.

(10) Patent No.: US 11,201,217 B2
(45) Date of Patent: Dec. 14, 2021

(54) NITRIDE SEMICONDUCTOR SUBSTRATE

(71) Applicant: CoorsTek KK, Tokyo (JP)

(72) Inventors: Kenichi Eriguchi, Hadano (JP); Yoshihisa Abe, Hadano (JP); Jun Komiyama, Hadano (JP)

(73) Assignee: COORSTEK KK, Tokyo (JP)

( * ) Notice: Subject to any disclaimer, the term of this patent is extended or adjusted under 35 U.S.C. 154(b) by 42 days.

(21) Appl. No.: 16/927,393

(22) Filed: Jul. 13, 2020

(65) Prior Publication Data

US 2021/0028284 A1 Jan. 28, 2021

(30) Foreign Application Priority Data

Jul. 24, 2019 (JP) .............................. JP2019-135975
May 26, 2020 (JP) .............................. JP2020-091085

(51) Int. Cl.
*H01L 29/207* (2006.01)
*H01L 29/06* (2006.01)
(Continued)

(52) U.S. Cl.
CPC ............ *H01L 29/207* (2013.01); *H01L 29/06* (2013.01); *H01L 21/0262* (2013.01);
(Continued)

(58) Field of Classification Search
CPC ........... H01L 21/02507; H01L 21/0254; H01L 21/02458; H01L 21/02389; H01L 29/06; H01L 29/1075; H01L 29/207; H01L 29/2003; H01L 29/778; H01L 29/7786; H01L 29/7787; H01L 29/7783; H01L 29/66452; H01L 2924/10323; H01L 2924/10344; H01L 2924/1033
See application file for complete search history.

(56) References Cited

U.S. PATENT DOCUMENTS 9,269,799 B2 * 2/2016 Ishiguro .............. H01L 29/2003
9,496,349 B2 * 11/2016 Lutgen .............. H01L 21/02381
(Continued)

FOREIGN PATENT DOCUMENTS

JP 2013074211 A 4/2013
JP 6419418 B2 11/2018

*Primary Examiner* — Jose R Diaz
(74) *Attorney, Agent, or Firm* — Buchanan Ingersoll & Rooney PC

(57) ABSTRACT

The characteristic of Fe-doped HEMTs is improved. The invention provides a nitride semiconductor substrate having a substrate, a buffer layer made of nitride semiconductors on the substrate, and an active layer composed of nitride semiconductor layers on the buffer layer; the buffer layer containing Fe, the Fe having a concentration profile in which the Fe concentration increases monotonically and gradually in the thickness direction of the buffer layer from an interface between the substrate and the buffer layer, has a maximum value within $2 \times 10^{17}$ to $1.1 \times 10^{20}$ atoms/cm$^3$ inclusive, and decreases monotonically and gradually toward an interface between the buffer layer and the active layer, and the point of the maximum value being within ±50 nm from the midpoint in the thickness direction of the buffer layer, and being 500 nm or more away from the interface between the buffer layer and the active layer.

1 Claim, 1 Drawing Sheet

(51) Int. Cl.
*H01L 29/20* (2006.01)
*H01L 29/778* (2006.01)
*H01L 21/02* (2006.01)

(52) U.S. Cl.
CPC .. *H01L 21/02381* (2013.01); *H01L 21/02458* (2013.01); *H01L 21/02507* (2013.01); *H01L 21/02579* (2013.01); *H01L 21/02581* (2013.01); *H01L 29/2003* (2013.01); *H01L 29/778* (2013.01); *H01L 2924/1033* (2013.01); *H01L 2924/10323* (2013.01); *H01L 2924/10344* (2013.01)

(56) References Cited

U.S. PATENT DOCUMENTS

| | | | | |
|---|---|---|---|---|
| 2013/0075786 | A1* | 3/2013 | Ishiguro | H01L 21/02507 257/194 |
| 2013/0256682 | A1* | 10/2013 | Ishiguro | H01L 21/02581 257/76 |
| 2017/0133217 | A1* | 5/2017 | Sato | H01L 29/2003 |

* cited by examiner

NITRIDE SEMICONDUCTOR SUBSTRATE

BACKGROUND OF THE INVENTION

Field of Invention

The present invention relates particularly to the structure of nitride semiconductor substrate doped with iron (Fe).

Description of the Related Art

With regard to a high electron mobility transistor (HEMT) using nitride semiconductors suitable for a high-frequency and high-power amplifier, there is a known technology for doping Fe, and carbon (C) if necessary, into a buffer layer in order to reduce the off-leakage current that flows between a source electrode and a drain electrode through a buffer layer in pinch-off or to inactivate donor impurities in the buffer layer to reduce the recovery time.

JP 6419418 B discloses a semiconductor device having a substrate; a buffer layer made of gallium nitride (GaN) doped with Fe and C on the substrate; a channel layer for electron transit made of GaN on the buffer layer; an electron supply layer to form therein a two-dimensional electron gas on the channel layer; a gate electrode formed on the electron supply layer; a drain electrode formed on the electron supply layer; and a source electrode formed on the electron supply layer. In the semiconductor device, the channel layer has a thickness of 0.5 μm or more, and the buffer layer has a thickness of 1 to 1.5 μm. The total amount of Fe and C is $1\times10^{16}$ to $1\times10^{18}$ atoms/cm$^3$ inclusive.

JP 2013-74211 A discloses the invention relating to a field effect transistor that prevents Fe from getting into a channel layer to suppress occurrence of cracks in semiconductor layers; having a high resistance layer made of a semiconductor material doped with an impurity element giving high resistivity, being formed on a substrate, an intermediate multilayer formed on the high resistance layer, a channel layer made of a semiconductor material formed on the intermediate multilayer, and an electron supply layer made of a semiconductor material formed on the channel layer. The invention discloses that the intermediate multilayer is composed of a multilayer film formed by alternately depositing a GaN layer and an aluminum nitride (AlN) layer, and that the intermediate layer made of AlN, placed between the high resistance layer and the channel layer, captures so much Fe as to have the peak of Fe concentration, which makes the amount of Fe taken in the channel layer less than that of the deposited semiconductor film without AlN, resulting in reduction of the amount of Fe taken in the channel layer.

SUMMARY OF THE INVENTION

JP 6419418 B and JP 2013-74211 A disclose that the peak position of Fe concentration, in other words, the region of high Fe concentration should be kept away from an interface between the channel layer and the buffer layer. However, it is hard to say that a nitride semiconductor substrate with the other characteristics suitable for a HEMT can be provided based on just such technical idea.

In response to the above issue, an object of the present invention is to improve plural characteristics with regard to the nitride semiconductor substrate doped with Fe.

The nitride semiconductor substrate of the present invention has a substrate, a buffer layer made of nitride semiconductors on the substrate, and an active layer composed of nitride semiconductor layers on the buffer layer. The buffer layer contains Fe, and the Fe has a concentration profile, in which the Fe concentration increases monotonically and gradually in the thickness direction of the buffer layer from an interface between the substrate and the buffer layer, has a maximum value within a range of $2\times10^{17}$ to $1.1\times10^{20}$ atoms/cm$^3$ inclusive, and then decreases monotonically and gradually toward an interface between the buffer layer and the active layer. The point of the maximum value is within a range of ±50 nm from the midpoint in the thickness direction of the buffer layer, and is 500 nm or more away from the interface between the buffer layer and the active layer.

With this configuration, it becomes possible to produce a nitride semiconductor substrate with a variety of excellent characteristics, which is suitably used as a HEMT.

According to the present invention, nitride semiconductor substrate using Fe as a dopant enables plural characteristics to coexist effectively in simple structure, which was so far regarded very difficult in the prior art.

DESCRIPTION OF THE PREFERRED EMBODIMENTS

Hereinafter, the present invention will be described in detail making reference to the drawings. The nitride semiconductor substrate of the present invention has a substrate, a buffer layer made of nitride semiconductors on the substrate, and an active layer composed of nitride semiconductor layers on the buffer layer. The buffer layer contains Fe, and the Fe has a concentration profile, in which the Fe concentration increases monotonically and gradually in the thickness direction of the buffer layer from an interface between the substrate and the buffer layer, has a maximum value within a range of $2\times10^{17}$ to $1.1\times10^{20}$ atoms/cm$^3$ inclusive, and then decreases monotonically and gradually toward an interface between the buffer layer and the active layer. The point of the maximum value is within a range of ±50 nm from the midpoint in the thickness direction of the buffer layer, and is 500 nm or more away from the interface between the buffer layer and the active layer.

Figure 1:
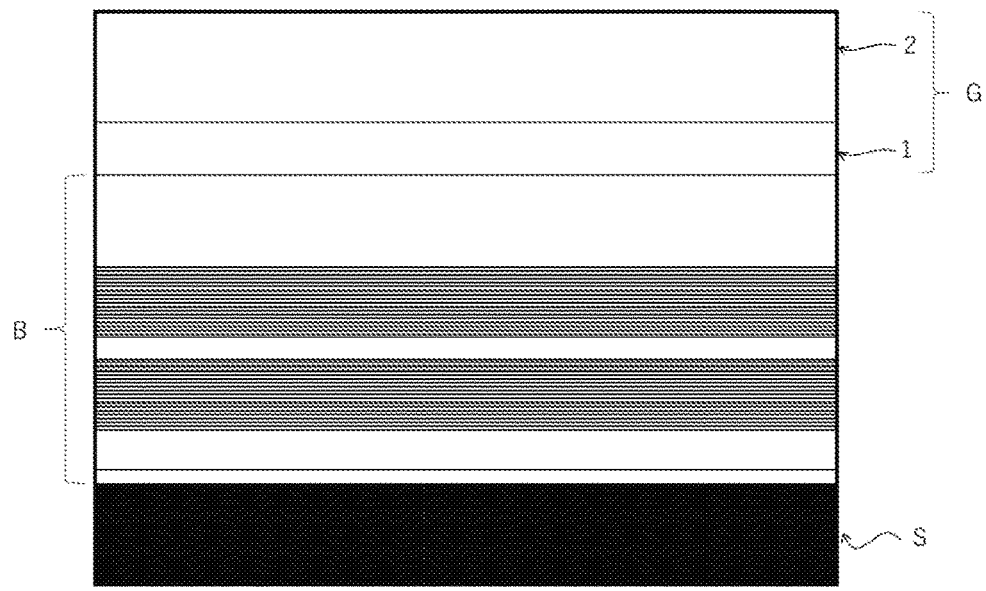
FIG. 1 is a cross-sectional schematic diagram showing the layer structure of nitride semiconductors according to an embodiment of the present invention.

FIG. 1 is a cross-sectional schematic diagram showing the layer structure of nitride semiconductors according to an embodiment of the present invention. Specifically, the nitride semiconductor substrate W has a structure in which a buffer layer B and an active layer G are successively deposited on one principal surface of a substrate S as a ground plane.

In the schematic diagrams presented in the present invention, shapes are schematically simplified and emphasized for explanation, and the shapes, dimensions and ratios of the details are different from the real ones. A reference sign is omitted for a configuration which is the same as that already shown, and further, any other configurations unnecessary to explain the present invention are not illustrated.

The substrate S may be not only silicon (Si) but also silicon carbide (SiC), sapphire (Al$_2$O$_3$), AlN, GaN or the like. It may be made of either a single material or different materials. Its plane orientation, dopant concentration and off angle may be set optionally.

The nitride semiconductors are made up combining at least one of group 13 elements, such as Ga, Al and indium (In), with nitrogen (N) and, if necessary, may be doped with various elements, such as O, Si and magnesium (Mg).

The buffer layer B has a stacked structure of plural nitride semiconductor layers, where any known structure is adopted in accordance with the uses and purposes. A more preferable form of the buffer layer B is the one which is prepared by forming an appropriate initial layer on the substrate S first, and then stacking nitride semiconductor layers which are different from each other in composition and impurity concentration.

In FIG. 1, the active layer G illustrates a first layer 1 and a second layer 2 having a wider band gap than the first layer 1, but is not restricted thereto. The active layer G can optionally include a layer having a wider band gap than the second layer 2 and a layer containing p-type conductive impurities with high concentration. The thickness of each layer and the concentration of impurities can be set arbitrarily depending on the purpose.

A specific embodiment of the present invention is designated by the structure in which the substrate S is a Si single crystal substrate, the buffer layer B is composed of plural layers of nitrides represented by $Al_xGa_{1-x}N$ ($0 \leq x \leq 1$), and the active layer G is composed of the first layer 1 of GaN and the second layer 2 of $Al_yGa_{1-y}N$ ($0 < y < 1$).

The nitride semiconductor substrate W is suitably used as not only a HEMT shown in FIG. 1 but also the other power devices which are capable of achieving high frequency and high withstand voltage, provided that the buffer layer B and the active layer G are formed on the substrate S.

The buffer layer B contains Fe. In the present invention, following the known art as described above, the primary purpose of Fe-doping is to increase the resistance of the buffer layer made of nitride semiconductors for reduction of leakage current.

The nitride semiconductor layer is preferably formed by heteroepitaxial growth on a substrate of a different material in a chamber of the vapor deposition apparatus. Some dislocations generated in growing the layers and impurities unintentionally put into the nitride semiconductors from a member for the chamber act as an n-type dopant, resulting in generation of the leakage current.

To suppress the leakage current, the method using compensation effect by means of p-type dopants is conventionally known. However, the p-type dopant acts as a trap level in case of having shallow levels, thereby causing the reduction of the operation current. Therefore the dopant level is preferably deep, and Fe is used as a p-type dopant at such deep levels.

However, roughness is generated at the interface of the formed layer because nitride semiconductors are easily to grow three-dimensionally with the addition of Fe. That may be a cause of leakage current generation. One example of the reduction of the leakage current is a method of forming a non Fe-doped buffer layer between the Fe-doped resistance layer and an AlN layer as the initial buffer layer to increase the resistivity of buffer layer while keeping the flatness of the interface owing to heat diffusion during film formation.

However, the foregoing method causes a reduction in electron mobility because Fe in the buffer layer moves into the electron supply layer owing to heat diffusion in the process of forming the channel layer and the electron supply layer as the active layer G on the Fe-doped buffer layer. In addition, roughness is generated at an interface with the channel layer and thereby a reduction in electron mobility also occurs.

A feature of the present invention lies in the lowering of the Fe concentration in the vicinity of both an interface between the buffer layer B and the substrate S and an interface between the active layer G (the channel layer, herein as an example) and the buffer layer B, in other words, keeping the position of the Fe concentration peak, by which high resistance is realized, away from both of the interfaces as much as possible.

With this constitution, the low Fe concentration enables each interface to keep the flatness and thereby the heat diffusion to the channel layer is suppressed, which can produce a nitride semiconductor with low leakage current and high-speed operation.

Additionally, having the Fe concentration peak which achieves high resistance, appropriately brings about an effect of reducing the leakage current. Accordingly, in the present invention, it is found that decrease of leakage current is compatible with suppression of reduction in the electron mobility.

According to a specific embodiment giving the foregoing advantage, the concentration of Fe contained in the buffer layer B increases monotonically and gradually in the thickness direction of the buffer layer B from an interface between the substrate S and the buffer layer B, has a maximum value within a range of $2 \times 10^{17}$ to $1.1 \times 10^{20}$ atoms/cm$^3$ inclusive, and then monotonically and gradually decreases toward an interface between the buffer layer B and the active layer G.

Figure 2:
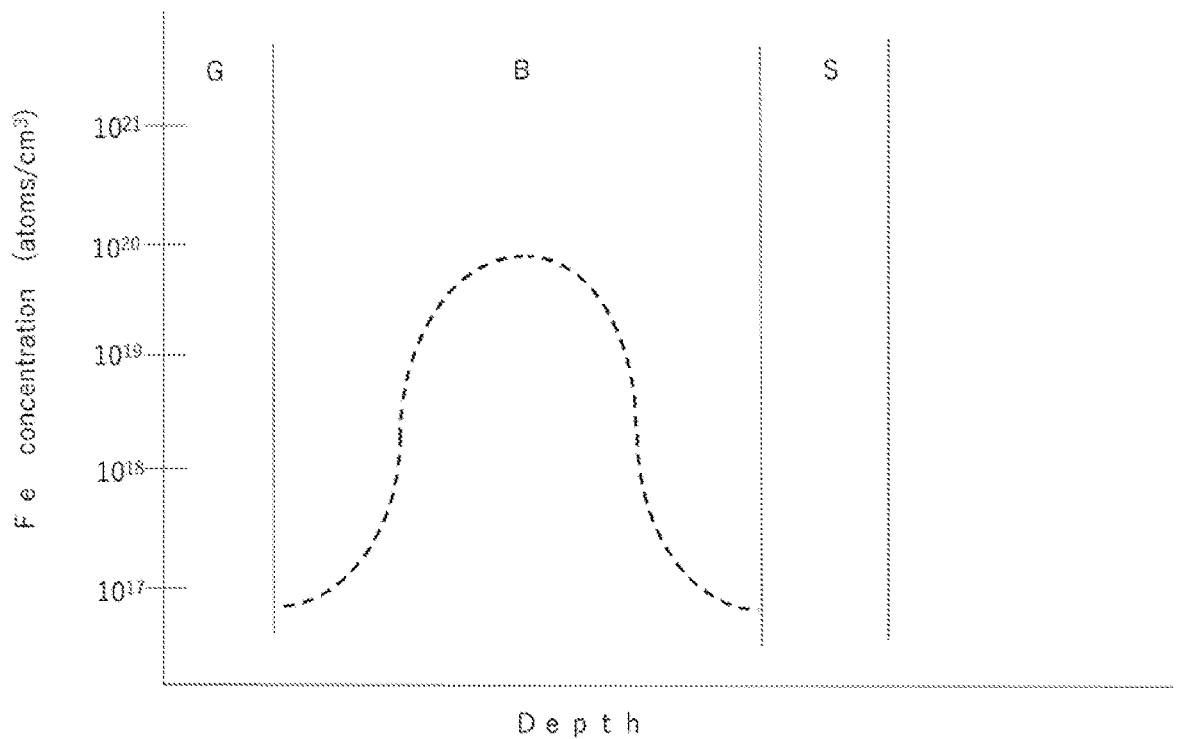
FIG. 2 is a schematic diagram showing Fe concentration profiles in nitride semiconductors according to an embodiment of the present invention.

FIG. 2 is a schematic diagram showing the Fe concentration profiles in the nitride semiconductor according to an embodiment of the present invention, that is to say, in which the peak of Fe concentration is positioned near the middle in the thickness direction of the buffer layer B. In other words, the advantage of the present invention can be obtained when the region of high concentration of Fe is set away from both upside and downside of interfaces.

Here, when the metal organic chemical vapor deposition (MOCVD) is used, the Fe concentration profile, as in FIG. 2 can be formed by timely adjusting growth rates, growth temperatures, the flow rate of a Fe source material, and the other gas flow rates in the process of depositing the buffer layer B.

The Fe concentration is measured by the secondary ion mass spectrometry (SIMS) in the thickness direction of the nitride semiconductor substrate, though other techniques besides SIMS are available.

Incidentally, in order to meet the characteristics required for nitride semiconductor substrates, such as dislocation density, warpage, withstand voltage and crystalline quality, the important requirements are that the buffer layer B as a whole does not have a single layer structure but a stacked multiple layer structure with a different composition, and has certain amount of thickness.

First, as for the thickness provided in the present invention, the thickness of the buffer layer B as a whole is set at 1200 nm or more and preferably 1800 to 3500 nm inclusive. Since too thick layer may cause the trouble in controlling a warpage of the whole substrate, the upper limit should be 4500 nm or less.

In view of enhancing other characteristics besides the advantage of the present invention, it is advisable that the buffer layer B have a structure in which plural layers with a different composition are stacked. In other words, even if the structure of buffer layer B is no more than a single structure, the advantage of the present invention can be obtained; while the other characteristics, especially the warpage of the substrate becomes too large to be of practical use. It should be noted that layer structures, e.g., layer thickness, composition, the number of deposition cycles are designed without any particular limitation.

To be more specific, the peak of Fe concentration should be positioned within a range of ±50 nm from the middle in the thickness direction of the buffer layer B, and at 500 nm or more away from an interface between the buffer layer B and the active layer G.

In the present invention, it is preferable that the peak of Fe concentration be positioned near the center of the buffer layer B; to be more precise, when the position deviates from a range of ±50 nm from the midpoint, either the interface between the buffer layer B and the active layer G, or the interface between the buffer layer B and the substrate S comes to relatively approach the peak of Fe concentration. It may fail to keep characteristics such as either reduction of leakage current or high-speed operation sufficiently, so that it is not desirable.

In the present invention, the peak position of the Fe concentration is 500 nm or more, and preferably approximately 2200 nm away from the interface between the buffer layer B and the active layer G. As is seen in the known art, high Fe concentration region lies near the active layer G, which undesirably results in the reduction of the high-speed operation. This is because a larger amount of Fe penetrate to the active layer G owing to heat diffusion in the process of manufacturing the nitride semiconductor substrate W.

In the present invention, it is preferable that the Fe concentration should be $1\times10^{17}$ atoms/cm$^3$ or less in the vicinity of both an interface between the substrate S and the buffer layer B and that between the buffer layer B and the active layer G. As described above, adverse effect caused by Fe-doping is avoidable by lowering the Fe concentration in the region in contact with the buffer layer B.

Thus, the present invention allows the nitride semiconductor substrate to reduce the leakage current and to achieve the high-speed operation. The nitride semiconductor device manufactured therefrom can be utilized as a high-performance semiconductor device.

In the present invention, an embodiment of hydrogen concentration in the buffer layer B becomes more preferable when the hydrogen concentration gradually increases toward the interface between the substrate S and the buffer layer B from the interface between the buffer layer B and the active layer G.

In the active layer G and its vicinity, the hydrogen concentration should not be very high from the viewpoint of not hindering the device operation. On the other hand, hydrogen should be of high concentration to some degree in the region of high Fe concentration in order to alleviate the deterioration of crystallinity, because the buffer layer B doped with Fe in high concentration may result in the deterioration of crystallinity.

Ideally, the hydrogen concentration profile should be designed according to the Fe concentration profile in order to meet with the above effect. Nevertheless, controlling the hydrogen concentration profile in the nitrides in the vapor deposition method like this is not so easy as the control of the amount of dopants such as Fe, carbon and Mg. It is more difficult to control the hydrogen concentration and the Fe concentration at the same time.

The present invention provides an easy way to make the hydrogen concentration profile according to the shape of the Fe concentration profile and to meet with the above effect.

That is, the present invention provides an embodiment of a profile where the hydrogen concentration gradually increases from the interface between the buffer layer B and the active layer G to the interface between the substrate S and the buffer layer B.

To be specific, the hydrogen concentration is $5\times10^{17}$ to $2\times10^{18}$ atoms/cm$^3$ inclusive in the active layer G, whereas in the buffer layer B, it gradually increases up to $4\times10^{18}$ to $3\times10^{19}$ atoms/cm$^3$ inclusive. The hydrogen concentration does not need to fit in strictly with the Fe concentration.

Also preferable is an embodiment in which the hydrogen concentration can gradually increase until it reaches the region where the Fe concentration peak exists and decreases in the direction of the substrate S. Because the latter half of this step does not exert a sufficient effect for high hydrogen concentration, and further, keeping the hydrogen concentration high up to this region results in only a little technical and cost advantage.

EXAMPLES

Hereinafter, the present invention will be described in detail with reference to examples, but the present invention is not restricted to the examples.

[Common Growth Condition]

A 6-inch P-type Si single crystal substrate of (111) plane orientation, used as the substrate S, was cleaned up by a well-known substrate cleaning method, and was subsequently placed in an MOCVD apparatus. After substituting the inside of the apparatus with a carrier gas, the temperature was raised and the substrate S was held at 1000° C. for 15 minutes in a 100% hydrogen atmosphere to remove a natural oxide film on the surface of the silicon single crystal.

Next, by vapor deposition using trimethylaluminum (TMAl), trimethylgallium (TMGa) and ammonia (NH$_3$) as source materials, an initial layer composed of a 100 nm-thick AlN layer and a 150 nm-thick Al$_{0.2}$Ga$_{0.8}$N thereon was grown and, on the initial layer, a multilayer was grown by repeating alternate deposition of a 5 nm-thick AlN layer and a 30 nm-thick Al$_{0.2}$Ga$_{0.8}$N layer eighty times, and subsequently a single layer composed of 1500 nm-thick GaN was grown on the multilayer. Thus formed structure including the initial layer, the repetition layer and the single layer in this order was used as the buffer layer B. The thickness of the buffer layer B was 4550 nm.

Then, a 100 nm-thick GaN layer as the first layer 1 and a 20 nm-thick Al$_{0.22}$Ga$_{0.78}$N layer as the second layer 2 were deposited in this order, to form the active layer G. The buffer layer B and the active layer G were formed by setting the growth temperature and pressure at 1050° C. and 60 hPa, respectively, as approximate references, and appropriately adjusting them for each of the layers.

Example 1

Cp$_2$Fe (dicyclopentadienyl iron, commonly known as ferrocene) was used to dope Fe as a Fe source material. During the process of repeatedly depositing multilayers, Cp$_2$Fe was supplied after two layers of a 5 nm-thick AlN and a 30 nm-thick Al$_{0.2}$Ga$_{0.1}$N were deposited repeatedly thirty times, and then the supply was stopped after the deposition was repeated eighty times. The Fe concentration was $1\times10^{20}$ atoms/cm$^3$ at its peak position, and each of the distance from the peak position to the active layer G and that from the peak position to the substrate S was approximately 2275 nm. This peak was positioned within a range of ±50 nm from the middle of the buffer layer B. As described above, an evaluation sample of Example 1 was prepared.

The foregoing Fe concentration profile is formed in such a way that Fe existing in the high-concentration layer uniformly spreads to the substrate S and the active layer G during vapor phase deposition after the supply of Fe is stopped. By using this, the Fe concentration peak can be formed in a prescribed region by adjusting flow rate, supply time, minor changes in growth temperature, and so on in supplying $Cp_2Fe$.

Example 2

An evaluation sample for Example 2 was prepared in a manner similar to Example 1, except that the flow rate of $Cp_2Fe$ and the growth temperature were adjusted so that Fe concentration at the peak position could be $2\times10^{17}$ atoms/$cm^3$.

Example 3

An evaluation sample for Example 3 was prepared in a manner similar to Example 1, except that the flow rate of $Cp_2Fe$ and the growth temperature were adjusted so that Fe concentration at the peak position could be $1.1\times10^{20}$ atoms/$cm^3$.

Example 4

An evaluation sample for Example 4 was prepared in a manner similar to Example 1, except that the flow rate of $Cp_2Fe$ and the growth temperature were adjusted so that the peak position could deviate from the middle of the buffer layer B by 50 nm on the side of the active layer G.

Example 5

An evaluation sample for Example 5 was prepared in a manner similar to Example 1, except that the flow rate of $Cp_2Fe$ and the growth temperature were adjusted so that the peak position could deviate from the middle of the buffer layer B by 50 nm on the side of the substrate S.

Example 6

An evaluation sample for Example 6 was prepared in a manner similar to Example 1, except that the GaN thickness in the buffer layer B was changed from 1500 nm to 700 nm. The peak position of Fe concentration was 1875 nm from an interface of the active layer G.

The growth conditions in any of the evaluation samples for the Examples were adjusted so that the Fe concentration could be approximately $1\times10^{17}$ atoms/$cm^3$ both in the vicinity of the interface between the substrate S and the buffer layer B and that of the interface between the buffer layer B and the active layer G. Each evaluation sample was cleaved across the diameter and the section was subjected to SIMS to determine the Fe concentration.

Comparative Example 1

In the process of depositing multilayers repeatedly, $Cp_2Fe$ started to be supplied when two layers of a 5 nm-thick AlN and a 30 nm-thick $Al_{0.2}Ga_{0.8}N$ were firstly deposited, and the supply was stopped after eighty times repetition of deposition. The Fe concentration was approximately $1\times10^{17}$ atoms/$cm^3$, having no peaks but flat profiles across the entire region of the buffer layer B. Thus an evaluation sample of Comparative Example 1 was prepared.

Comparative Example 2

In the process of depositing multilayers repeatedly, $Cp_2Fe$ started to be supplied when two layers of a 5 nm-thick AlN and a 30 nm-thick $Al_{0.2}Ga_{0.8}N$ were firstly deposited, the deposition was repeated eighty times, and in the process of depositing the 1500 nm-thick GaN layer, the supply of $Cp_2Fe$ was stopped when the GaN thickness reached 1000 nm. The Fe concentration was approximately $1\times10^{20}$ atoms/$cm^3$, having no peaks but flat profiles across the entire region of the buffer layer B. Thus an evaluation sample of Comparative Example 2 was prepared.

Comparative Example 3

In the process of depositing multilayers repeatedly, $Cp_2Fe$ started to be supplied when two layers of a 5 nm-thick AlN and a 30 nm-thick $Al_{0.2}Ga_{0.8}N$ were firstly deposited, the deposition was repeated eighty times, and in the process of depositing the 1500 nm-thick GaN layer, the supply of $Cp_2Fe$ was stopped when the GaN thickness reached 250 nm. A Fe concentration of $1\times10^{20}$ atoms/$cm^3$ was observed at an interface of the substrate S, and until it reached $1\times10^{17}$ atoms/$cm^3$, the Fe concentration gradually decreased toward an interface of the active layer G without any peaks. Thus an evaluation sample of Comparative Example 3 was prepared.

Comparative Example 4

In the process of depositing the 1500 nm-thick GaN layer, $Cp_2Fe$ started to be supplied when the GaN thickness reached 450 nm and stopped when it reached 1500 nm. Fe concentration was $1\times10^{17}$ atoms/$cm^3$ at an interface of the substrate S, and until it reached $1\times10^{20}$ atoms/$cm^3$, the Fe concentration gradually increased toward an interface of the active layer G without any peaks. Thus an evaluation sample of Comparative Example 4 was prepared.

Comparative Example 5

An evaluation sample for Comparative Example 5 was prepared in a manner similar to Example 1, except that the flow rate of $Cp_2Fe$ and the growth temperature were adjusted so that the peak position could deviate from the middle of the buffer layer B by 70 nm on the side of the active layer G.

Comparative Example 6

An evaluation sample for Comparative Example 6 was prepared in a manner similar to Example 1, except that the flow rate of $Cp_2Fe$ and the growth temperature were adjusted so that the peak position could deviate from the middle of the buffer layer B by 70 nm on the side of the substrate S.

Comparative Example 7

An evaluation sample for Comparative Example 7 was prepared in a manner similar to Example 1, except that the GaN thickness in the buffer layer B was changed from 1500 nm to 300 nm, and except that the flow rate of $Cp_2Fe$ and the growth temperature were adjusted so that the peak position could deviate much from the middle of the buffer layer B.

The peak position of Fe concentration was 450 nm from an interface of the active layer G.

[Evaluation 1: Warpage]

The BOW of each evaluation sample was measured with a general-purpose warpage measuring device usually used for measuring the shape of a semiconductor substrate. A BOW value of −50 μm or more and 20 μm or less was determined to be satisfactory or "A", and the one of more than 20 m to be unsatisfactory or "C".

[Evaluation 2: Withstand Voltage]

A strip-shaped test piece with a width of 20 mm was cut from the center part to the edge part of the substrate main surface of each evaluation sample. Next, the electron supply layer 2 and the channel layer 1 of the test piece were partly removed by dry etching. A 10 mm²-sized Au electrode was vacuum deposited on the surface exposed by the dry etching to form a Schottky electrode. To compare the current values at 600V, by conducting electricity on the Si single crystal substrate side, using a commercially available curve tracer, I-V characteristic was measured. $1 \times 10^{-8}$ A or less was determined to be satisfactory or "A", and more than $1 \times 10^{-8}$ A to be unsatisfactory or "C".

[Evaluation 3: High-Speed Operation]

The evaluation samples were subjected to Hall effect measurement by the Van der Pauw method to evaluate the electron mobility. First, each of the evaluation samples was cut into a 7 mm square chip, and at four corners of the electron supply layer 2 in each chip, a Ti/Al electrode with a diameter of 0.25 mm was formed by vacuum evaporation. After performing alloying heat treatment at 600° C. in a nitrogen atmosphere for 5 minutes, the chips were subjected to the Hall effect measurement with ACCENT HL5500PC. Levels of the mobility were expressed in comparison with Comparative Example 1.1 or less was determined to be poor or "C", more than 1 and 1.1 or less to be good or "B", and 1.2 or more to be excellent or "A". A and B were determined to be passed.

Table 1 summarizes data and evaluation results of each evaluation sample.

TABLE 1

| Evaluation Sample | Warp-age | With-stand Voltage | High-speed Operation | Remarks |
|---|---|---|---|---|
| Ex. 1 | A | A | A | All characteristics are good. |
| Ex. 2 | A | A | B | |
| Ex. 3 | A | A | A | Warpage is slightly inferior to that of Ex. 1. |
| Ex. 4 | A | A | B | |
| Ex. 5 | A | A | A | Withstand voltage is slightly inferior to that of Ex. 1 |
| Ex. 6 | A | A | B | |
| Comp. Ex. 1 | A | C | A | |
| Comp. Ex. 2 | C | A | C | many high Fe concentration regions, more warped |
| Comp. Ex. 3 | C | A | A | |
| Comp. Ex. 4 | A | A | C | |
| Comp. Ex. 5 | C | A | A | superior to Comp. Ex. 3 |
| Comp. Ex. 6 | A | A | C | superior to Comp. Ex. 4 |
| Comp. Ex. 7 | A | A | C | |

As is obviously seen in Table 1, all the samples within the scope of the present invention are excellent in all the characteristics such as warpage, withstand voltage, and high-speed operation.

What is claimed is:

1. A nitride semiconductor substrate having a substrate, a buffer layer made of nitride semiconductors on the substrate, and an active layer composed of nitride semiconductor layers on the buffer layer;

the buffer layer containing Fe, the Fe having a concentration profile in which the Fe concentration increases monotonically and gradually in the thickness direction of the buffer layer from an interface between the substrate and the buffer layer, has a maximum value within a range of $2 \times 10^{17}$ to $1.1 \times 10^{20}$ atoms/cm³ inclusive, and then decreases monotonically and gradually toward an interface between the buffer layer and the active layer, and the point of the maximum value being within a range of ±50 nm from the midpoint in the thickness direction of the buffer layer, and being 500 nm or more away from the interface between the buffer layer and the active layer.

* * * * *